United States Patent
Jeon et al.

(10) Patent No.: US 10,230,154 B2
(45) Date of Patent: Mar. 12, 2019

(54) MULTI FEEDING ANTENNA AND ELECTRONIC DEVICE INCLUDING THE SAME

(71) Applicant: Samsung Electronics Co., Ltd., Gyeonggi-do (KR)

(72) Inventors: Jae-Woong Jeon, Gyeonggi-do (KR); Dong-Hun Park, Gyeonggi-do (KR); Siyoul Jang, Gyeonggi-do (KR); Changtae Kim, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/938,531

(22) Filed: Mar. 28, 2018

(65) Prior Publication Data
US 2018/0288203 A1  Oct. 4, 2018

(30) Foreign Application Priority Data
Mar. 28, 2017 (KR) .......................... 10-2017-0039326

(51) Int. Cl.
| | | |
|---|---|---|
| H01Q 1/24 | (2006.01) | |
| H01Q 5/30 | (2015.01) | |
| H01Q 5/50 | (2015.01) | |
| H05K 1/02 | (2006.01) | |
| H01Q 5/35 | (2015.01) | |

(52) U.S. Cl.
CPC ............ H01Q 1/241 (2013.01); H01Q 1/242 (2013.01); H01Q 5/30 (2015.01); H01Q 5/50 (2015.01); H05K 1/0243 (2013.01); *H01Q 5/35* (2015.01)

(58) Field of Classification Search
CPC ............ H01Q 1/241–1/245; H01Q 5/00–5/55
See application file for complete search history.

(56) References Cited

U.S. PATENT DOCUMENTS

| | | | |
|---|---|---|---|
| 9,502,775 B1 | 11/2016 | Gummalla et al. | |
| 10,075,203 B2* | 9/2018 | Kim | H04B 1/1009 |
| 2009/0322639 A1 | 12/2009 | Lai | |
| 2012/0305652 A1* | 12/2012 | Weakley | G06K 19/0723 |
| | | | 235/492 |
| 2013/0127674 A1* | 5/2013 | Korva | H01Q 1/243 |
| | | | 343/702 |
| 2013/0141304 A1 | 6/2013 | Chen | |
| 2013/0328742 A1 | 12/2013 | Hirobe et al. | |
| 2016/0344439 A1 | 11/2016 | Seol et al. | |
| 2017/0033459 A1 | 2/2017 | Tsai | |
| 2017/0047791 A1* | 2/2017 | Jang | H02J 50/90 |
| 2017/0244149 A1* | 8/2017 | Kim | H01Q 5/307 |
| 2017/0250460 A1* | 8/2017 | Shin | H01Q 1/243 |
| 2018/0269561 A1* | 9/2018 | Kim | H01Q 1/085 |
| 2018/0277934 A1* | 9/2018 | Kim | H01Q 1/243 |

FOREIGN PATENT DOCUMENTS

| | | |
|---|---|---|
| KR | 1020130022208 | 3/2013 |
| KR | 1020160120643 | 10/2016 |

OTHER PUBLICATIONS

International Search Report dated Jun. 26, 2018 issued in counterpart application No. PCT/KR2018/003603, 9 pages.

* cited by examiner

*Primary Examiner* — Duc M Nguyen
(74) *Attorney, Agent, or Firm* — The Farrell Law Firm, P.C.

(57) ABSTRACT

Disclosed is an electronic device which may provide a multi-feeding antenna operating in multiple frequency bands by reducing performance degradation, and can contribute to slimness by implementing at least a portion of the patterns in a printed circuit board.

20 Claims, 11 Drawing Sheets

MULTI FEEDING ANTENNA AND ELECTRONIC DEVICE INCLUDING THE SAME

CROSS-REFERENCE TO RELATED APPLICATION(S)

This application is based on and claims priority under 35 U.S.C. § 119 to Korean Patent Application No. 10-2017-0039326, filed on Mar. 28, 2017, in the Korean Intellectual Property Office, the disclosure of which is incorporated by reference herein in its entirety.

BACKGROUND

1. Field

The disclosure relates to a multi-feeding antenna and an electronic device including the same.

2. Description of the Related Art

As functional differentials between electronic devices of various manufacturers have noticeably decreased, slimmer electronic devices are being developed in order to meet consumers' demands. Yet, such electronic devices are increasing in rigidity and improved design aspects.

Electronic devices may support various wireless communication services such as long term evolution (LTE), wireless fidelity (Wi-Fi), near field communication (NFC), and Bluetooth®, and may include at least one antenna device for supporting various frequencies of various wireless communication services.

In an antenna device used in an electronic device, the volume and number of antenna radiators mounted therein may be determined according to a frequency, a bandwidth, and a type of each service. For example, the antenna device may use a low band ranging from 700 megahertz (MHz) to 1000 MHz, a mid band ranging from 1700 MHz to 2200 MHz, and a high band ranging from 2200 MHz to 2700 MHz as a main communication band. In another example, various wireless communication services such as Bluetooth® (BT), global positioning system (GPS), and wireless fidelity Wi-Fi may be used.

In order to provide a wireless communication service on par with wired communication, an electronic device may adopt a multiple-input multiple-output (MIMO) method using a plurality of antennas having the same frequency band, and thus may realize increased data processing speed and reliability, without additional radio frequency (RF) consumption. Therefore, the MIMO method may solve existing problems of wireless communication, such as signal attenuation, interference increase, and spectrum restriction. However, since the MIMO method has to use the plurality of antennas, it may be used in a large electronic device such as a base station, but it may be difficult to apply the MIMO to a slimmer portable electronic device, such as a smart phone.

As a solution to these problems, isolated mode antenna technology (iMAT™) using a plurality of feeding points for a single antenna may be applied, and may provide high electromagnetic (EM) isolation, low correlation, and high radiation efficiency, compared to a related-art system feeding a plurality of antennas.

Such an electronic device includes a signal antenna pattern disposed on a structure, such as an antenna carrier, and different regions of the antenna pattern are respectively fed, and thus, operate in the same frequency band such that data transmission and reception efficiency can be enhanced. In this case, respective feeding regions are electrically connected with one another by an isolation pattern, which corresponds to an electric length by which an electric field is minimized, which ensures high EM isolation between two radiation regions. However, if antenna regions formed by respective patterns operate in multiple bands including a first frequency band, such as a 2.4 GHz band, and a second frequency band, such as a 5 GHz band isolation in the first frequency band would be possible, but the second frequency band would cause performance degradation. In addition, if the second frequency band is tuned, performance degradation in the first frequency band is caused, thus requiring the electronic device to frequently perform a trade-off In addition, as a display region of a conductive material is gradually extended on the front surface of the electronic device, the antenna radiation pattern formed only in the structure accompanying a restriction to a disposal space may incur degraded radiation efficiency due to interference by the display.

As such, there is a need in the art for an antenna that obviates such performance degradation in an electronic device.

SUMMARY

An aspect of the present disclosure is to address at least the above-mentioned problems and/or disadvantages and to provide at least the advantages described below. Accordingly, an aspect of the present disclosure is to provide a multi-feeding antenna implemented to reduce radiation performance degradation in multiple bands, and an electronic device including the same.

According to embodiments, there is provided an electronic device including a housing comprising a first plate, a second plate facing toward a direction opposite the first plate, and a side surface member surrounding a space between the first plate and the second plate, the side surface member being integrally formed with or attached to the second plate, a touch screen display exposed through a portion of the first plate, a printed circuit board (PCB) disposed in parallel between the first plate and the second plate, a wireless communication circuit mounted in the PCB, a first conductive pattern formed in a first portion of the PCB, a second conductive pattern formed in a second portion of the PCB when viewed from the upper portion of the second plate, at least a portion of the wireless communication circuit being interposed between the first conductive pattern and the second conductive pattern, and a conductive path formed on the PCB and electrically connecting the first conductive pattern and the second conductive pattern, wherein the wireless communication circuit is configured to provide a first signal having a first frequency and a second signal having a second frequency higher than the first frequency to the first conductive pattern and the second conductive pattern.

According to embodiments, there is provided an electronic device including a housing including a first plate, a second plate facing toward a direction opposite the first plate, and a side surface member surrounding a space between the first plate and the second plate, the side surface member being integrally formed with the second plate or being attached to the second plate, a PCB disposed in parallel between the first plate and the second plate, wireless communication circuit mounted in the PCB, a first conductive pattern disposed in a first portion of the PCB, a second conductive pattern disposed in a second portion of the PCB, a conductive path disposed on the PCB and electrically connecting the first conductive pattern and the second conductive pattern; a structure of a dielectric material disposed to overlap at least a portion of the PCB on the PCB, a third conductive pattern disposed on the structure and electrically connected with the first conductive pattern, and a fourth conductive pattern disposed on the structure and electrically disconnected from the third conductive pattern, and electrically connected with the second conductive pattern, wherein the wireless communication circuit is configured to provide a first signal having a first frequency and a second signal having a second frequency higher than the first frequency to the first conductive pattern and the second conductive pattern.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
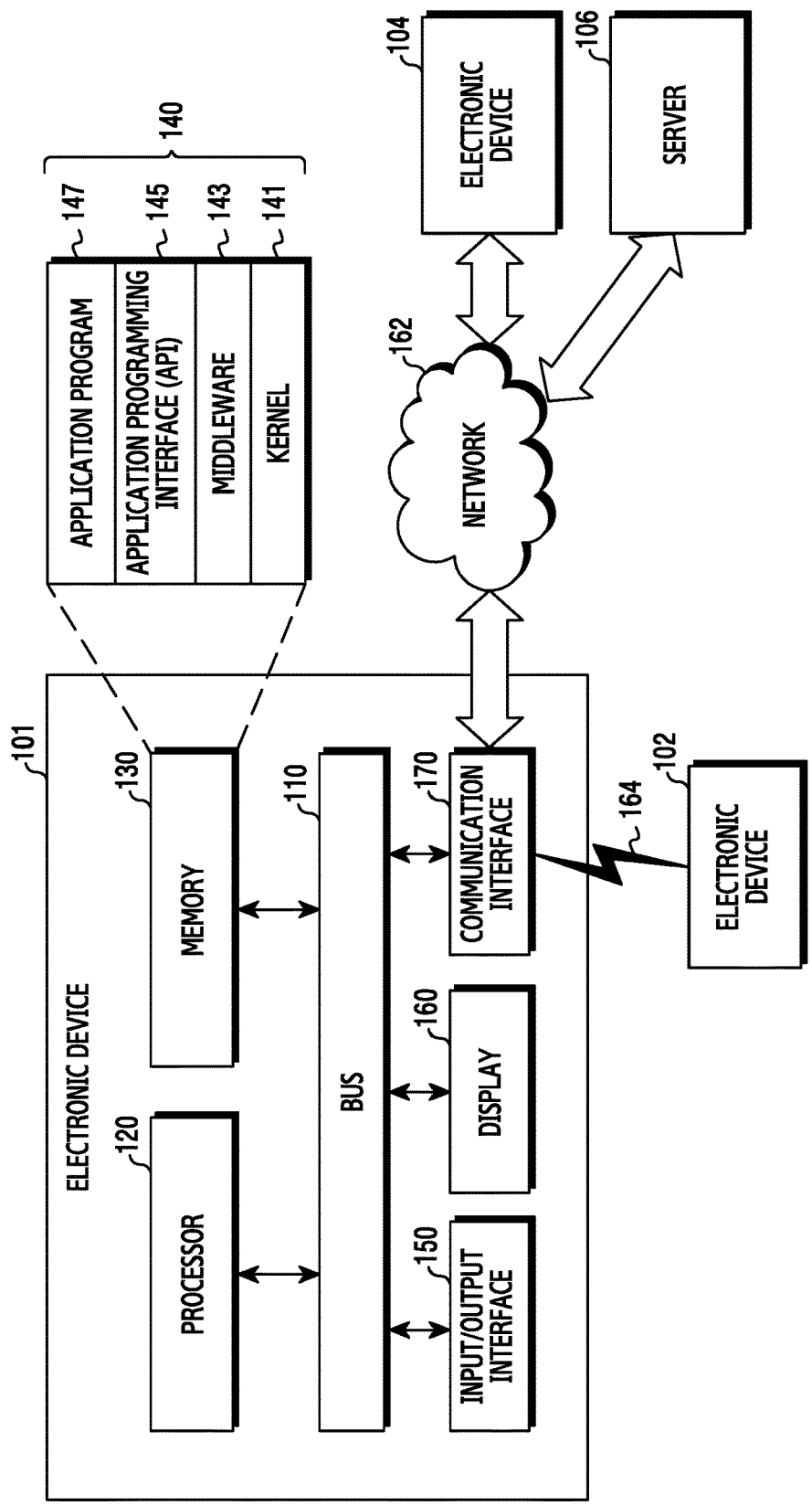
FIG. 1 illustrates a network environment including an electronic device according to embodiments.

Embodiments will now be described in greater detail with reference to the accompanying drawings, in which similar reference numerals may be used to refer to similar elements. In the following disclosure, specific details such as detailed configuration and components are merely provided to assist the overall understanding of the disclosure. Therefore, it should be apparent to those skilled in the art that various changes and modifications of the embodiments described herein can be made without departing from the scope and spirit. For example, those skilled in the art will understand that the principles may be implemented in any suitably arranged electronic device. In addition, descriptions of well-known functions and constructions may be omitted for clarity and conciseness.

The terms and words used in the following description and claims are not limited to their dictionary meanings, but are used to convey a clear and consistent understanding. Accordingly, it should be apparent to those skilled in the art that the following description of embodiments is provided for illustrative purposes only and not for the purpose of limiting the present disclosure.

Singular terms such as "a," "an," and "the" include plural references unless the context clearly dictates otherwise. Thus, "a component surface" includes reference to one or more of such surfaces.

Herein, expressions such as "have," "may have," "include," and "may include" refer to the presence of corresponding elements such as numerical values, functions, operations, or parts, but do not preclude the presence of additional features.

The expressions "A or B," "at least one of A or/and B," and "one or more of A or/and B" include all possible combinations of the enumerated items, such as (1) at least one A, (2) at least one B, or (3) at least one A and at least one B.

Numerical terms, such as "first" and "second", may use corresponding components regardless of an order and/or importance of the elements, and do not limit the elements. These terms may be used for the purpose of distinguishing one element from another element. For example, a first user device and a second user device may indicate different user devices, regardless of the order or importance the devices, and a first element may be referred to as a second element, and similarly, a second element may be referred to as a first element, without departing from the scope the present disclosure.

When a first element is operatively or communicatively coupled with/to or connected to a second element, the first element may be directly coupled with/to the second element, or there may be an intervening third element between the first and second elements. However, when the first element is directly coupled with/to or directly connected to the second element, there is no intervening third element therebetween.

Herein, the term "module" may refer to a unit including one of hardware, software, and firmware, or any combination thereof, may be interchangeably used with terms, such as unit, logic, logical block, component, and circuit, may be a minimum unit of an integrally constituted component for performing one or more functions or may be a part thereof, and may be mechanically or electrically implemented. For example, a module may include at least one of a dedicated processor, a central processing unit (CPU), an application-specific integrated circuit (ASIC) chip, a field-programmable gate array (FPGA), and a programmable-logic device, which are known or will be developed in the future and which perform certain operations.

All of the terms used herein, including technical or scientific terms, have the same meanings as those generally understood by a person having ordinary skill in the related art unless they are defined otherwise. Terms defined in a generally used dictionary should be interpreted as having the same or similar meanings as the contextual meanings of the relevant technology and should not be interpreted as having ideal or exaggerated meanings unless clearly defined as such herein. Even terms defined in the disclosure should not be interpreted as excluding embodiments.

Example electronic devices may include smart phones, tablet personal computers (PCs), mobile phones, video telephones, electronic book readers, desktop PCs, laptop PCs, netbook computers, workstations, servers, personal digital assistants (PDAs), portable multimedia players (PMPs), motion picture experts group (MPEG-1 or MPEG-2) audio layer 3 (MP3) players, mobile medical devices, cameras, and/or wearable devices, but are not limited thereto. For example, the wearable devices may include accessory-type wearable devices, such as watches, rings, bracelets, anklets, necklaces, glasses, contact lenses, or head-mounted-devices (HMDs), fabric or clothing integral wearable devices, such as electronic clothes, body-mounted wearable devices, such as skin pads or tattoos, and/or implantable wearable devices, such as implantable circuits, but are not limited thereto.

The electronic devices may include smart home appliances, such as televisions (TVs), digital versatile disk (DVD) players, audio players, refrigerators, air conditioners, cleaners, ovens, microwave ovens, washing machines, air cleaners, set-top boxes, home automation control panels, security control panels, TV boxes, such as Samsung HomeSync™, Apple TV™, or Google TV™), game consoles, such as Xbox™ and PlayStation™), electronic dictionaries, electronic keys, camcorders, and/or electronic picture frames, but are not limited thereto.

The electronic devices may include a portable medical measurement device, such as a blood glucose meter, a heart rate monitor, a blood pressure monitor, or a thermometer, a magnetic resonance angiography (MRA) device, a magnetic resonance imaging (MRI) device, a computed tomography (CT) device, a scanner, an ultrasonic device, a navigation device, a GPS receiver, an event data recorder (EDR), a flight data recorder (FDR), a vehicle infotainment device, electronic equipment for a vessel, such as navigation systems and gyrocompasses, an avionics device, a security device, a head unit for a vehicle, an industrial or home robot, an automated teller machine (A™), a point of sales (POS) device, and/or an Internet of things (IoT) device, such as a light bulb, sensor, electric or gas meter, sprinkler device, fire alarm, thermostat, street lamp, toaster, exercise equipment, hot water tank, heater, or boiler.

The electronic device may also include a part of furniture or building/structure, electronic board, electronic signature receiving device, projector, or measuring instrument, such as a water, electricity, gas, or wave meter.

The electronic device may be a flexible electronic device and may be a combination of the above-described devices.

Additionally, the electronic device is not limited to the above-described devices, and may include a new electronic device according to the development of new technologies.

Herein, the term "user" may refer to a person who uses an electronic device or may refer to an artificial intelligence (AI) electronic device which uses an electronic device.

FIG. 1 illustrates an example network environment including an electronic device, according to an embodiment.

Referring to FIG. 1, the network environment includes an electronic device 101, which includes a bus 110, a processor 120 including processing circuitry, a memory 130, an input/output interface 150 including input/output circuitry, a display 160, and a communication interface 170 including communication circuitry. Alternatively, the electronic device 101 may omit at least one of the illustrated components and/or include additional components.

The bus 110 is a circuit for connecting the components 120 through 170 and delivering communications such as a control message therebetween.

The processor 120 may include various processing circuitry, such as at least one of a dedicated processor, a CPU, an application processor (AP), and/or a communication processor (CP), and processes an operation or data on control of and/or communication with another component of the electronic device 101.

The processor 120 may also include a microprocessor or any suitable type of processing circuitry, such as one or more general-purpose processors, a digital signal processor (DSP), a programmable logic device (PLD), an ASIC, a field-programmable gate array (FPGA), a graphical processing unit (GPU), and a video card controller. In addition, when a general purpose computer accesses code for implementing the processing shown herein, the execution of the code transforms the general purpose computer into a special purpose computer for executing the processing shown herein.

The processor 120, which can be connected to an LTE network, may determine whether a call is connected over a circuit switched (CS) service network using caller identification information, such as a caller phone number of the second generation (2G) or a 3rd generation (3G) network. For example, the processor 120 receives incoming call information, such as a CS notification message or a paging request message of the CS service network over the LTE network, such as circuit-switched fallback (CSFB), and receives incoming call information, such as a paging request message over the CS service network, such as single radio LTE (SRLTE).

When receiving an incoming CS notification message or a paging request message of the CS service network over the LTE network, the processor 120 may obtain caller identification information from the incoming call information, may display the caller identification information on the display 160, and may determine whether to connect the call based on input information corresponding to the caller identification information displayed on the display 160. For example, when detecting input information corresponding to an incoming call rejection, through the input/output interface 150, the processor 120 may restrict the voice call connection and maintain the LTE network connection. When detecting input information corresponding to an incoming call acceptance, through the input/output interface 150, the processor 120 may connect the voice call by connecting to the CS service network.

When receiving the incoming CS notification message or a paging request message of the CS service network over the LTE network, the processor 120 may obtain caller identification information from the incoming call information and may determine whether to connect the call by comparing the caller identification information with a reception control list. For example, when the caller identification information is included in a first reception control list, such as a blacklist, the processor 120 may restrict the voice call connection and maintain the connection to the LTE network. When the caller identification information is not included in the blacklist, the processor 120 may connect the voice call by connecting to the CS service network. When the caller identification information is included in a second reception control list, such as a white list, the processor 120 may connect the voice call by connecting to the CS service network.

When receiving the incoming call information, such as a paging request message of the CS service network over the LTE network, the processor 120 may send an incoming call response message, such as a paging response message, to the CS service network, may suspend the LTE service and receive the caller identification information, such as a circuit-switched call (CC) setup message, from the CS service network, and may determine whether to connect the call by comparing the caller identification information with the reception control list. For example, when the caller identification information is included in the blacklist, the processor 120 restricts the voice call connection and resumes the LTE network connection. When the caller identification information is not included in the he blacklist, the processor 120 may connect the voice call by connecting to the CS service network. For example, when the caller identification information is included in the white list, the processor 120 connects the voice call by connecting to the CS service network.

The memory 130 may include volatile and/or nonvolatile memory, may store one or more instructions or data, such as the reception control list relating to the other components of the electronic device 101, and may store software and/or a program 140 including a kernel 141, middleware 143, an application programming interface (API) 145, and/or application program 147. At least two of the kernel 141, the middleware 143, and the API 145 may be referred to as an operating system (OS).

The kernel 141 may control or manage system resources, such as the bus 110, the processor 120, or the memory 130, used for performing an operation or function implemented by the other programs, such as the middleware 143, the API 145, or the application 147, and may provide an interface for enabling the middleware 143, the API 145, or the application 147 to access individual elements of the electronic device 101 to control or manage the system resources.

The middleware 143 may function as an intermediary for the API 145 or the applications 147 to communicate with the kernel 141, such as to exchange data.

In addition, the middleware 143 may process one or more task requests received from the application 147 according to priorities thereof. For example, the middleware 143 assigns priorities for using the system resources of the electronic device 101, to at least one of the application 147, or performs scheduling or load balancing on the one or more task requests by processing the one or more task requests according to the priorities assigned thereto.

The API 145 is an interface through which the applications 147 may control functions provided from the kernel 141 or the middleware 143, and may include at least one interface or function, such as an instruction for file control, window control, image processing, or text control.

The input/output interface 150 may include various input/output circuitry and function as an interface that transfers instructions or data input from a user or another external device to the other elements of the electronic device 101, and may output the instructions or data received from the other elements of the electronic device 101 to the user or an external electronic device.

The display 160 may include a liquid crystal display (LCD), a light emitting diode (LED) display, an organic LED (OLED) display, a micro electro mechanical system (MEMS) display, an electronic paper display, but is not limited thereto. The display 160 may display various types of content, such as text, images, videos, icons, or symbols, and may display a web page.

The display 160 may include a touch screen, which receives a touch, a gesture, proximity, or hovering input, for example, using an electronic pen or a user's body part, such as a finger.

The communication interface 170 may include various communication circuitry and establishes communication between the electronic device 101 and a first external electronic device 102, a second external electronic device 104, and/or a server 106, such as by using wireless communication or wired communication or via a short-range communication 164. For example, the wireless communication conforms to a cellular communication protocol including at least one of LTE, LTE-advanced (LTE-A), code division multiple access (CDMA), wireless CDMA (WCDMA), universal mobile telecommunication system (UMTS), wireless broadband (WiBro), and GSM.

The wired communication may include at least one of a universal serial bus (USB), a high definition multimedia interface (HDMI), a recommended standard 232 (RS-232), and a plain old telephone service (POTS).

The network 162 may include a telecommunications network, a computer network such as local area network (LAN) or wide area network (WAN), the Internet, and a telephone network.

The electronic device 101 may provide an LTE service in a single radio environment by use of at least one module functionally or physically separated from the processor 120.

Each of the first and second external electronic devices 102 and 104 may be the same or a different type of device as the electronic device 101.

The server 106 may include a group of one or more servers.

All or some of the operations to be executed by the electronic device 101 may be executed by the first external electronic device 102, the second external electronic device 104, and/or the server 106. For example, when the electronic device 101 performs a certain function or service (automatically or by request), the electronic device 101 may request some functions that are associated therewith from the first external electronic device 102, the second external electronic device 104, and/or the server 106, instead of or in addition to executing the function or service itself The first external electronic device 102, the second external electronic device 104, and/or the server 106 may execute the requested functions or additional functions, and may transmit the results to the electronic device 101 which may provide the requested functions or services by processing the received results. For example, a cloud, distributed, or client-server computing technique may be used.

The processor 210 may determine a current mode of the electronic device based on a result detected in at least one of the above-described sensor modules according to an example embodiment, may generate a control signal based on the determined current mode, and may adjust an operating frequency band of a conductive member of the electronic device in a low band by controlling a tunable circuit using the corresponding control signal.

Figure 2:
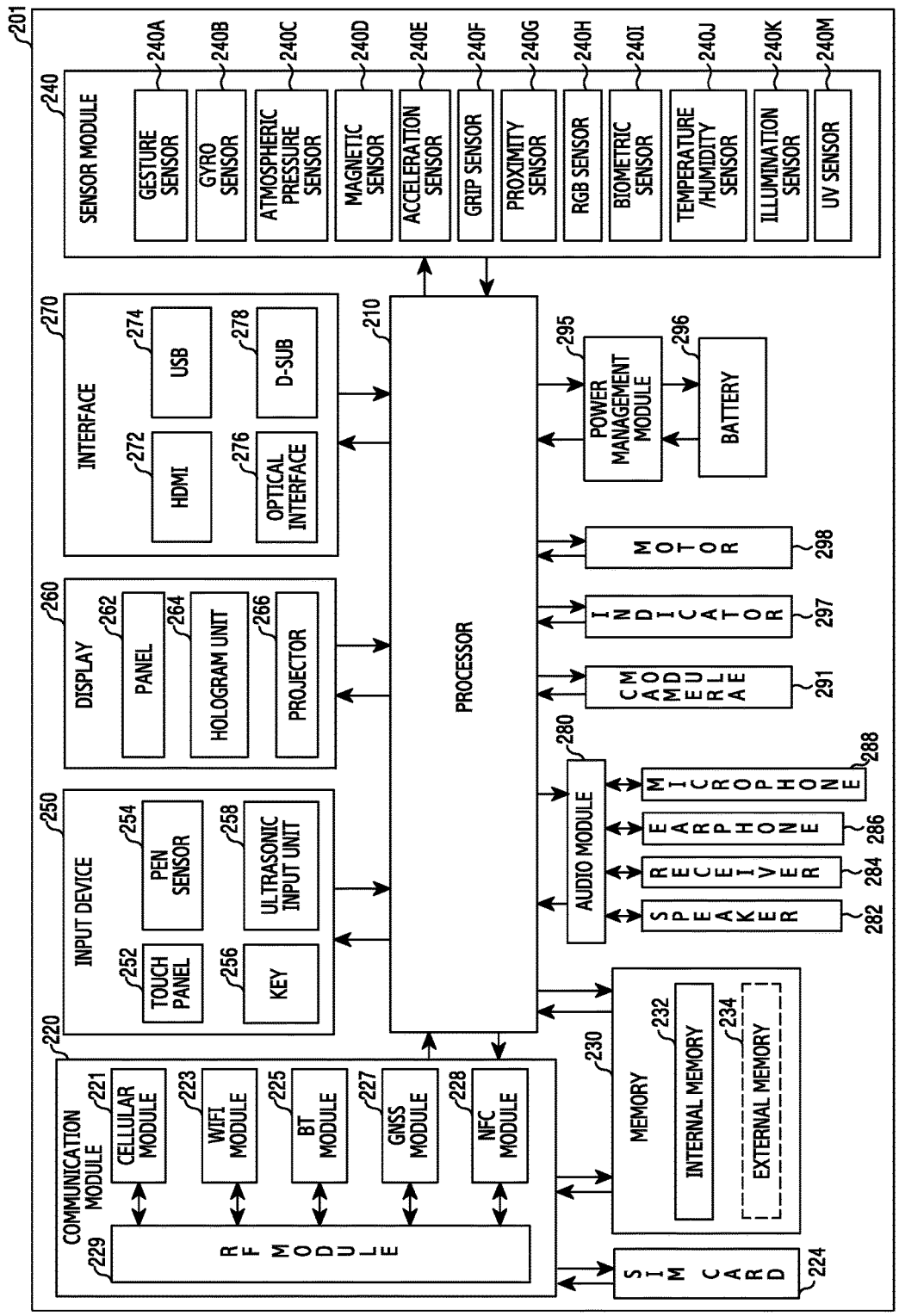
FIG. 2 illustrates an electronic device according to embodiments.

FIG. 2 is a diagram illustrating an example electronic device, according to an embodiment.

Referring to FIG. 2, the electronic device 201 includes a processor 210 including processing circuitry, a communication module 220 including communication circuitry, a subscriber identification module (SIM) card 224, a memory 230, a sensor module 240, an input device 250 including input circuitry, a display 260, an interface 270 including interface circuitry, an audio module 280, a camera module 291, a power management module 295, a battery 296, an indicator 297, and a motor 298.

The processor 210 may include various processing circuitry and control a plurality of hardware or software elements connected to the processor 210 by driving an OS or an application program, may process a variety of data, including multimedia data, perform arithmetic operations, may be implemented with a system on chip (SoC), and may further include a GPU.

The communication module 220 may include various communication circuitry, such as at least one of a cellular module 221, a Wi-Fi module 223, a Bluetooth® (BT) module 225, a global navigation satellite system (GNSS) or GPS module 227, a near field communication (NFC) module 228, and a radio frequency (RF) module 229, and may perform data transmission/reception between an external electronic device and/or a server, which may be connected with the electronic device through a network.

The cellular module 221 may provide a voice call, a video call, a text service, or an Internet service through a communication network, such as LTE, LTE-A, CDMA, WCDMA, UMTS, WiBro, or GSM, may identify and authenticate the electronic device within the communication network by using the SIM card 224, and may perform at least some of the functions that can be provided by the processor 210, such as multimedia control functions.

The cellular module 221 may include a CP and may be implemented with an SoC.

Although elements, such as the cellular module 221, the memory 230, and the power management module 295 are illustrated as separate elements with respect to the processor 210 in FIG. 2, the processor 210 may also be implemented as including at least one of these elements.

The processor 210 or the cellular module 221 may load an instruction or data, which is received from each non-volatile memory connected thereto or at least one of different elements, to a volatile memory and process the instruction or data. In addition, the processor 210 or the cellular module 221 may store data, which is received from at least one of different elements or generated by at least one of different elements, into a non-volatile memory.

Each of the Wi-Fi module 223, the BT module 225, the GNSS module 227, and the NFC module 228 may include a processor for processing data transmitted/received through a corresponding module, and at least two of these modules may be included in one integrated chip (IC) or IC package and may be implemented with an SoC.

The RF module 229 may transmit/receive an RF signal, may include a transceiver, a power amp module (PAM), a frequency filter, or a low noise amplifier (LNA), and may further include a component for transmitting/receiving a radio wave on a free space in wireless communication, such as a conductor or a conducting wire. The cellular module 221, the Wi-Fi module 223, the BT module 225, the GNSS module 227, and the NFC module 228 may share the RF module 229, or at least one of these modules may transmit/receive an RF signal via a separate RF module.

The SIM card 224 may be inserted into a slot formed in the electronic device and includes unique identification information, such as an integrated circuit card identifier (ICCID) or subscriber information, such as an international mobile subscriber identity (IMSI).

The memory 230 includes an internal memory 232 and/or an external memory 234.

The internal memory 232 may include at least one of a volatile memory, such as a dynamic random access memory (DRAM), a static RAM (SRAM), or a synchronous dynamic RAM (SDRAM) or a non-volatile memory, such as a one-time programmable read only memory (OTPROM), a programmable ROM (PROM), an erasable and programmable ROM (EPROM), an electrically erasable and programmable ROM (EEPROM), a mask ROM, a flash ROM, a not and (NAND) flash memory, and a not or (NOR) flash memory, and may be a solid state drive (SSD).

The external memory 234 may include a flash drive, a compact flash (CF), secure digital (SD), micro-SD, mini-SD, extreme digital (xD), and a memory stick, and may be operatively coupled to the electronic device via various interfaces.

The electronic device may also include a storage unit (or a storage medium), such as a hard drive.

The sensor module 240 may measure a physical quantity or detect an operation state of the electronic device, and convert the measured or detected information into an electrical signal, and includes a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H, such as a red, green, blue (RGB) sensor, a biometric sensor 240I, a temperature/humidity sensor 240J, an illumination sensor 240K, and an ultraviolet (UV) sensor 240M.

Additionally or alternatively, the sensor module 240 may include other sensors, such as an E-node sensor, an electromyography (EMG) sensor, an electroencephalogram (EEG) sensor, an electrocardiogram (ECG) sensor, and/or a fingerprint sensor.

The sensor module 240 may further include a control circuit for controlling at least one or more sensors included therein.

The input device 250 includes at least one of a touch panel 252, a (digital) pen sensor 254, a key 256, and an ultrasonic input unit 258. The touch panel 252 may recognize a touch input by using at least one of an electrostatic type configuration, a pressure-sensitive type configuration, and an ultrasonic type configuration, and may further include a control circuit. When the touch panel is of the electrostatic type, both physical contact recognition and proximity recognition are possible. The touch panel 252 may further include a tactile layer, which provides the user with a tactile reaction.

The (digital) pen sensor 254 may include a recognition sheet which can be a part of the touch panel or can be separately implemented from the touch panel. The (digital) pen sensor 254 may be implemented using the same or similar method of receiving a touch input of a user or using an additional recognition sheet.

The key 256 may include a physical button, an optical key, or a keypad.

The ultrasonic input device 258 may detect ultrasonic waves generated by an input tool through a microphone 288, and may identify data corresponding to the detected ultrasonic waves.

The ultrasonic input unit 258 may detect a reflected sound wave through the microphone 288 and perform radio recognition. For example, an ultrasonic signal, which may be generated by using a pen, may be reflected off an object and detected by the microphone 288.

The electronic device may use the communication module 220 to receive a user input from an external device, such as a computer or a server connected thereto.

The display 260 includes a panel 262, a hologram device 264, and a projector 266.

The panel 262 may be an LCD or an AM-OLED and may be implemented in a flexible, transparent, or wearable manner, and may be constructed as one module with the touch panel 252.

The hologram device 264 uses an interference of light and displays a stereoscopic image in the air.

The projector 266 displays an image by projecting a light beam onto a screen, which may be located inside or outside the electronic device.

The display 260 may further include a control circuit for controlling the panel 262, the hologram device 264, and/or the projector 266.

The interface 270 may include at least one of an HDMI 272, a USB 274, an optical communication interface 276, and a d-subminiature (D-sub) 278, and may further include a mobile high-definition link (MHL), SD/multi-media card (MMC), and/or an Infrared Data Association (IrDA) port.

The audio module 280 bilaterally converts a sound and an electric signal, which is input or output through a speaker 282, a receiver 284, an earphone 286, and/or the microphone 288.

The speaker 282 may output a signal of an audible frequency band and a signal of an ultrasonic frequency band. Reflected waves of an ultrasonic signal emitted from the speaker 282 and a signal of an external audible frequency band may be received.

The camera module 291 captures an image and/or a video, and may include one or more image sensors, such as a front sensor or a rear sensor, a lens, an image signal processor (ISP), or a flash, such as an LED or a xenon lamp. Alternatively, the electronic device may include two or more camera modules.

The power management module 295 manages power of the electronic device and may include a power management integrated circuit (PMIC), a charger IC, and/or a battery gauge.

The PMIC may be included in an IC or an SoC semiconductor and may use a wired charging and/or a wireless charging method. The charger IC may charge the battery 296 and may prevent an over-voltage or over-current flow.

Different types of wireless charging may include magnetic resonance type, magnetic induction type, and electromagnetic type. An additional circuit for the wireless charging, such as a coil loop, a resonant circuit, and/or a rectifier may be added.

The battery gauge may measure a residual quantity of the battery 296 and a voltage, current, and temperature during charging. The battery 296 stores or generates electricity and supplies power to the electronic device by using the stored or generated electricity, and may include a rechargeable battery or a solar battery.

The indicator 297 indicates a specific state, such as a booting, message, or charging state of the electronic device or a part thereof, such as the processor 210.

The motor 298 converts an electric signal into a mechanical vibration.

Alternatively, the electronic device includes a processing unit, such as a GPU, for supporting mobile TV, which processes media data according to a protocol, such as digital multimedia broadcasting (DMB), digital video broadcasting (DVB), and/or media flow.

Each of the aforementioned elements of the electronic device 201 may include one or more components, and the names thereof may vary depending on a type of the electronic device 201. Some of the elements illustrated in FIG. 2 may be omitted, and/or additional elements may be included therein. In addition, some of the elements of the electronic device 201 may be combined and constructed as a single entity, so as to equally perform functions of corresponding elements as prior to the combination.

At least some parts of the electronic device 201, such as modules, functions, or operations, may be implemented with an instruction stored in a non-transitory computer-readable storage media and executed by the processor 210 to perform a function corresponding to the instruction. The non-transitory computer-readable storage media may be the memory 230. At least some parts of the programming module may be executed by the processor 210. At least some parts of the programming module may include modules, programs, routines, and a set of instructions for performing one or more functions.

Figure 3:
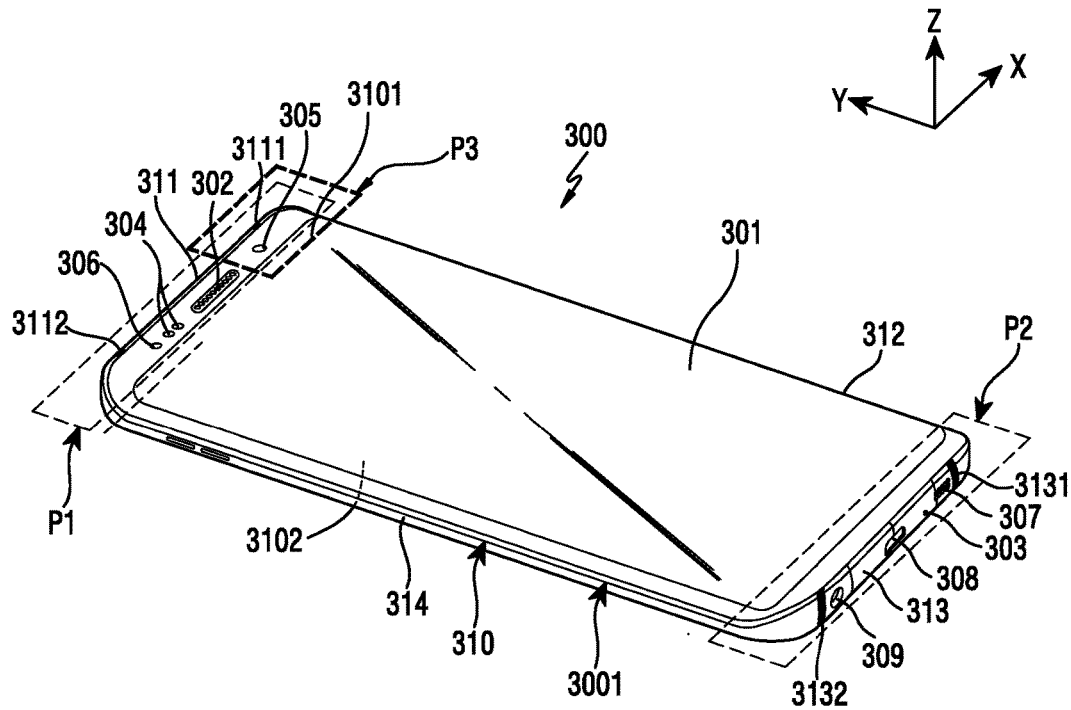
FIG. 3 is a perspective view of an electronic device according to embodiments.

FIG. 3 is a perspective view of an electronic device according to embodiments.

Referring to FIG. 3, the electronic device 300 may include a housing 3001 formed of a conductive member and/or a nonconductive member and may include a first plate 3101, a second plate 3102 facing toward a direction opposite the first plate 3101, and a side surface member 310 disposed to surround a space between the first plate 3101 and the second plate 3102. The side surface member 310 may be integrally formed with the second plate 3102 and may be disposed by being coupled to the second plate 3102.

The electronic device 300 may include a touch screen display 301 disposed to be exposed from at least a portion of the first plate and including a force sensor, to enable a force sensitive touch screen display. The electronic device 300 may include a receiver 302 disposed in the housing 3001 to output a voice of the other person, and a microphone device 303 disposed in the housing 3001 to transmit a user's voice to the other person.

The electronic device 300 may include components disposed to be exposed from the touch screen display 301 or disposed not to be exposed although they perform functions through a window, and may perform various functions of the electronic device 300. The components may include at least one sensor module 304 including, for example, an illuminance sensor, such as an optical sensor, a proximity sensor, such as an optical sensor, an infrared sensor, an ultrasonic sensor, a fingerprint recognition sensor, or an iris recognition sensor. The components may include a camera device 305, and an indicator 306, such as a light emitting diode (LED) device, for visually providing state information of the electronic device to the user. At least one of the components may be disposed to be exposed through at least a portion of the second plate 3102.

The electronic device 300 may include a speaker device 307, an interface connector port 308 to perform a data transmission and reception function by an external device and to receive external power and to charge the electronic device 300, and an ear jack assembly 309.

The touch screen display 301 may be disposed to define, as a display region, substantially the entire first plate 3101 of the electronic device 300 and a portion of the side surface member 310 or a portion of the second plate 3102 including the side surface member 310. In this case, the above-described electronic components, such as at least one of the speaker device, the microphone device, various sensor modules, or the camera device, may be disposed to perform their respective functions through the touch screen display 301 (or window) inside the electronic device, or to be exposed through the housing 310 rather than through a display region.

The side surface member 310 may include a first side surface 311 extended in a first direction (X-axis direction) and having a first length, a second side surface 312 extended in a second direction (Y-axis direction) perpendicular to the first direction and having a second length longer than the first length, a third side surface 313 extended in parallel with the first side surface 311 and having the first length, and a fourth side surface 314 extended in parallel with the second side surface 312 and having the second length. The first side surface 311 may include nonconductive members 3111, 3112 spaced apart from each other by a predetermined distance between the second side surface 312 and the fourth side surface 314. The third side surface may include nonconductive members 3131, 3132 spaced apart from each other by a predetermined distance between the second side surface and the fourth side surface. At least one of the first side surface 311 to the fourth side surface 314 that is segmented by the nonconductive member may be utilized as an antenna radiator.

The electronic device 300 may include at least one antenna disposed therein in an upper region, such as the P1 region in FIG. 3, or a lower region, such as the P2 region in FIG. 3, away from the touch screen display 301 inside the electronic device 300.

The antenna may include a multi-feeding antenna to feed signals to different regions of a single pattern. The multi-feeding antenna may be disposed in a P3 region illustrated in FIG. 3, may operate in multiple bands in respective regions, may maximize isolation between two antenna regions by forming an isolation pattern in a PCB and by mounting at least one element, such as a low pass filter, for isolation on the isolation pattern, and may prevent radiation performance degradation caused by interference among different operating frequencies while operating in multiple bands, which is a problem of the iMAT™ method arising when all antenna patterns are arranged in a structure. The multi-feeding antenna may be implemented by forming an isolation pattern and a portion thereof, which have been mounted in a structure, in the PCB, and by electrically connecting a conductive pattern of the structure and a pattern of the PCB to overlap each other at least in part in the Z-axis direction, and thus may enhance the slimness of the electronic device.

Figure 4:
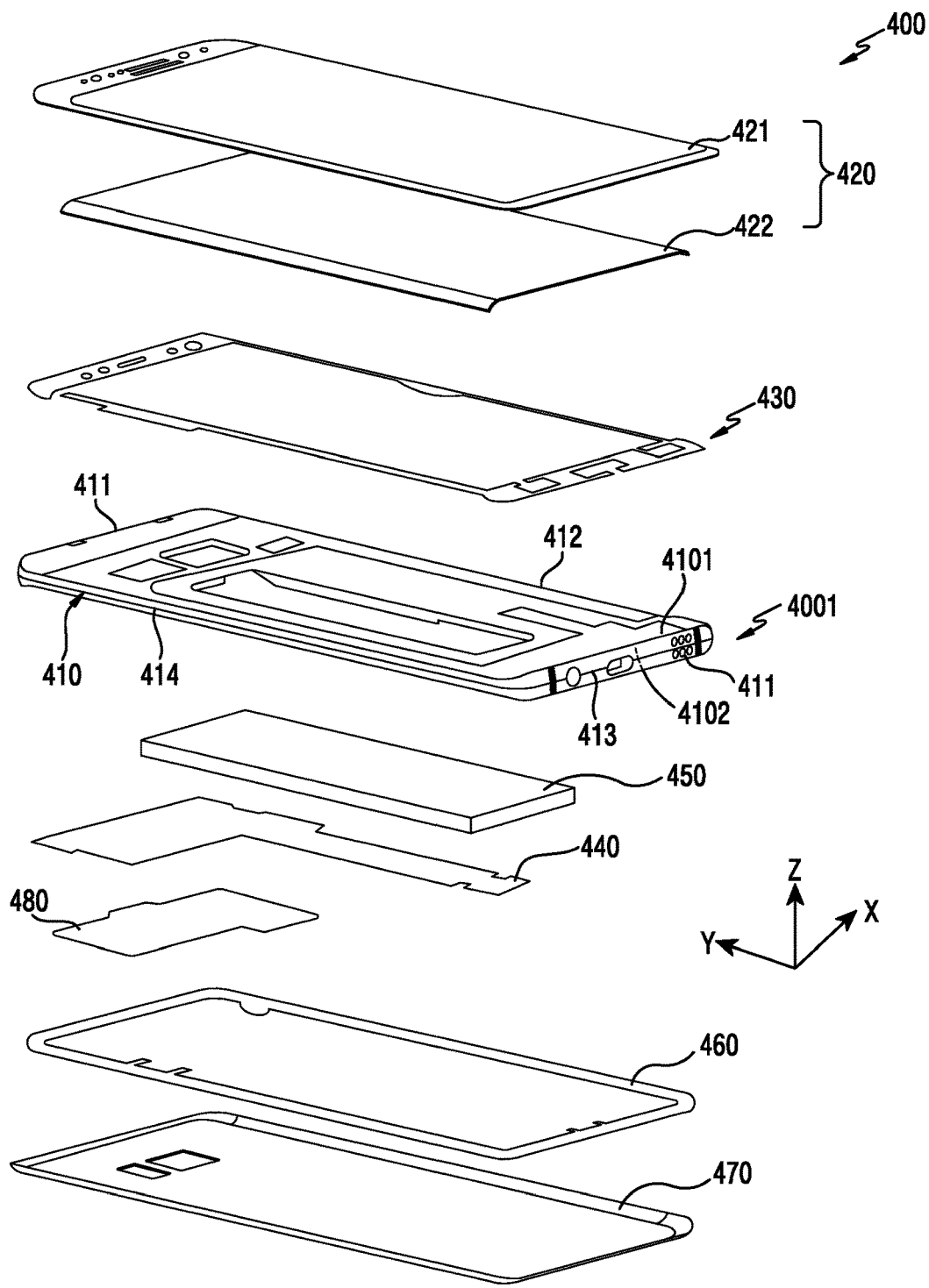
FIG. 4 is an exploded perspective view of an electronic device according to embodiments.

FIG. 4 is an exploded perspective view of an electronic device according to embodiments.

Referring to FIG. 4, the electronic device 400 may include a support member 4001 including a first surface 4101, a second surface 4102 facing toward a direction opposite the first surface 4101, and a side surface member 410 disposed to surround borders of the first surface 4101 and the second surface 4102 and including a first side surface 411 extended in a first direction (X-axis direction) and having a first length, a second side surface 412 extended in a second direction (Y-axis direction) perpendicular to the first direction and having a second length longer than the first length, a third side surface 413 extended in parallel with the first side surface 411 and having the first length, and a fourth side surface 414 extended in parallel with the second side surface 412 and having the second length. The support member 4001 may be integrally formed with the side surface member 410 or may be formed in a coupling method.

The electronic device 400 may include at least one first seal member 430, and a touch screen display 420 including a first plate 421, such as a front surface window or a glass plate, a touch display module 422 attached to a rear surface of the first plate 421, a PCB 440, a structure 480, a battery 450, a second seal member 460, and a second plate 470, such as a rear surface window or a rear surface cover, and may further include a wireless power reception member and a detection member for detecting an electronic pen applied as a data inputting means. The detection member may include an electromagnetic resonance (EMR) sensor pad which operates in an electromagnetic induction method in order to receive a feedback signal generated by a resonance frequency of a coil body provided in the electronic pen.

The battery 450 may be received in a receiving space formed in the support member 4001, and may be disposed to avoid the PCB 440 or to overlap at least a portion of the PCB 440. The battery 450 and the PCB 440 may be disposed in parallel with each other without overlapping each other.

The touch screen display 420 may include the first plate 421 and the touch display module 422 disposed on the rear surface of the first plate 421. The touch display module 422 may include a force detection sensor.

The electronic device 400 may be a waterproof structure which prevents moisture from permeating an inner space formed by the support member 4001 by the first seal member 430 and the second seal member 460. The first seal member 430 and the second seal member 460 may include at least one of a double-sided tape, an adhesive, waterproof dispensing, silicon, waterproof rubber, or urethane The PCB 440 may include a conductive pattern, which is at least a portion of the multi-feeding antenna according to an example embodiment. The structure 480 may be formed of a high molecular material. The structure 480 may include a conductive pattern, which is the other portion of the above-described multi-feeding antenna. The PCB 440 may be fixed by being attached between the support member 4001 and the second surface 4102. The structure 480 may be disposed to overlap the PCB 440 at least in part between the support member 4001 and the second surface. When the structure 480 is mounted in the PCB 440, a conductive pattern of the structure 480 may be electrically connected with a conductive pattern of the PCB 440 and may operate as a single antenna.

Figure 5:
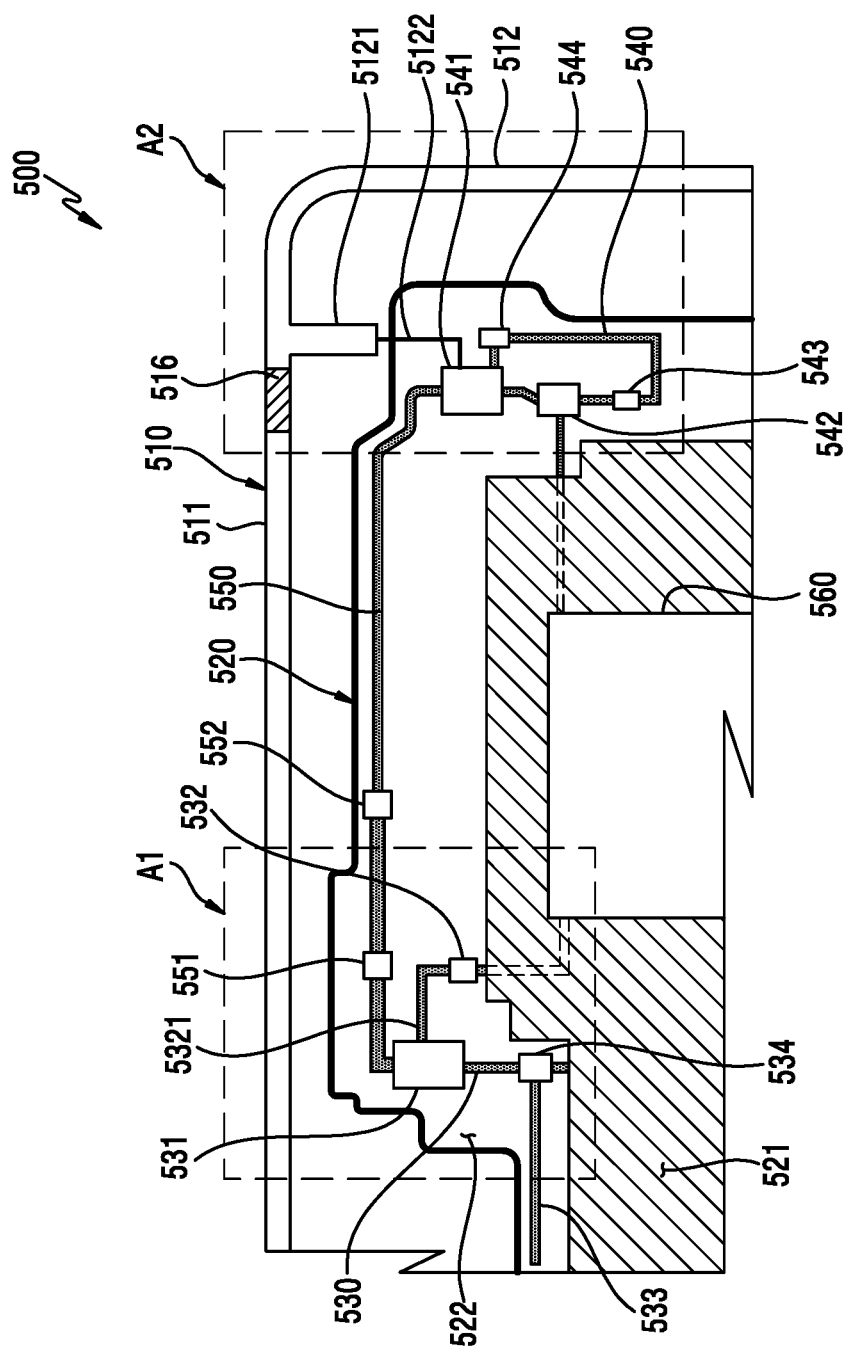
FIG. 5 illustrates a PCB including a conductive pattern according to embodiments.

FIG. 5 illustrates a PCB including a conductive pattern according to embodiments. An antenna disposed in the PCB of FIG. 5 may be disposed in the P3 region of the electronic device 300 of FIG. 3.

Referring to FIG. 5, the PCB 520 may be disposed between a support member including a side surface member 510, and a second surface. The PCB 520 may include a ground plane 521, such as a conductive region, and a fill-cut region 522, such as a nonconductive region, and may include a multi-feeding antenna 500 disposed in the fill-cut region 522 and including a first antenna region A1 and a second antenna region A2.

The first antenna region A1 and the second antenna region A2 may be electrically connected with each other by a wireless communication circuit 560, and may be configured as a single antenna by being electrically connected with each other. The first antenna region A1 may operate as a multi-band antenna in a first frequency band, such as a 2.4 GHz operating frequency band, and a second frequency band higher than the first frequency band, such as a 5 GHz operating frequency band. The second antenna region A2 may operate as a multi-band antenna in the first frequency band and the second frequency band higher than the first frequency band.

Figure 6:
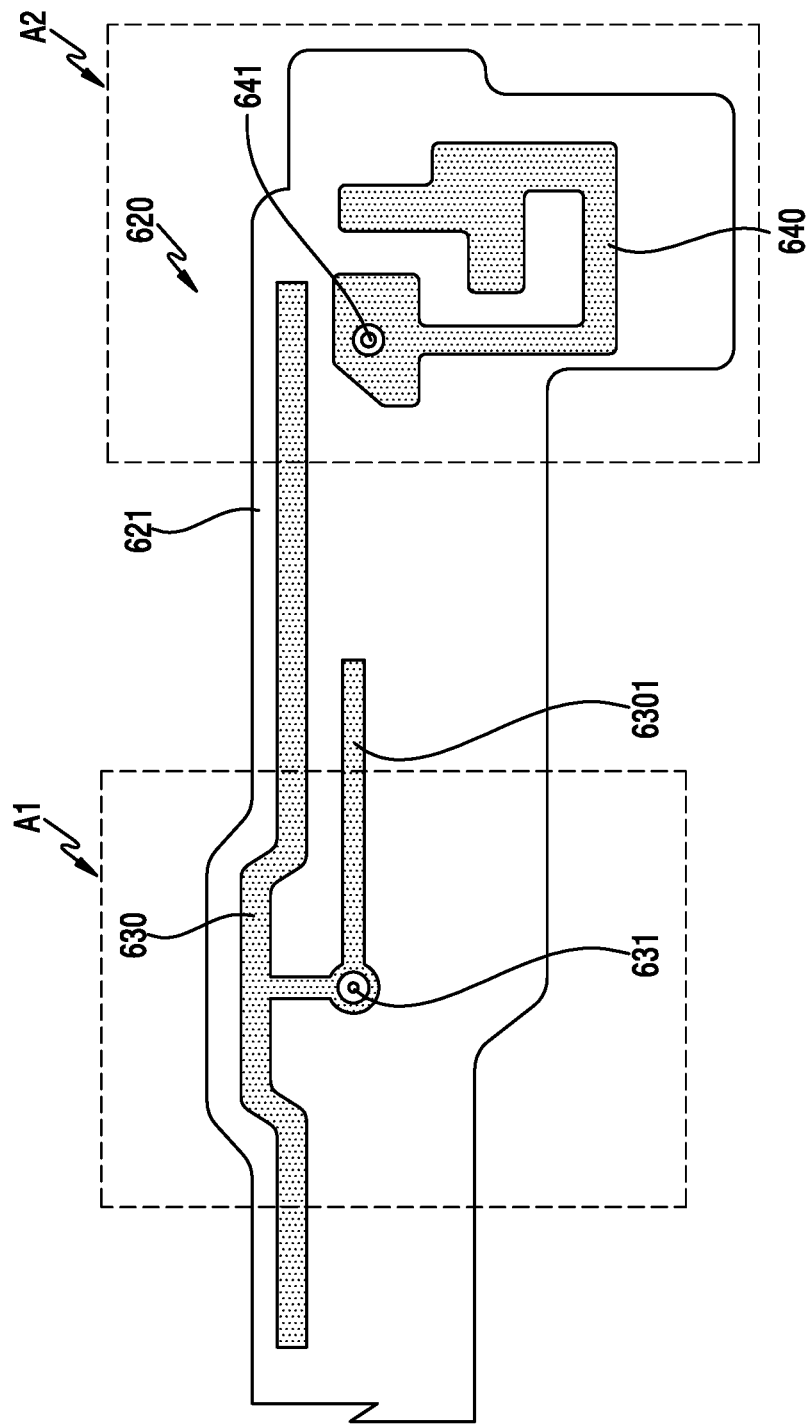
FIG. 6 illustrates a structure including a conductive pattern according to embodiments.

Referring to FIGS. 5 and 6, the multi-feeding antenna 500 may include a first conductive pattern 530 disposed in the first antenna region A1 and electrically connected with the wireless communication circuit 560 via a feeding path 5321 formed in the fill-cut region 522. A matching circuit 532 may be mounted on the feeding path 5321. A first access member 531 may be disposed at one end of the first conductive pattern 530 and may be electrically with a third access member 631 disposed on a third conductive pattern 630 of a structure 621 when the structure 621 is disposed in the PCB 520.

The other end of the first conductive pattern 530 may be electrically connected with the ground plane 521 to operate as a semi planar inverted F antenna (PIFA) with the third conductive pattern 630 of the structure 621. At least one connection circuit 534 may be disposed on the first conductive pattern 530, which may include an open stub 533 branching off from the connection circuit 534 and having a predetermined length. The open stub 533 may operate in the second frequency band, such as the 5 GHz frequency band, by being electrically connected with the first conductive pattern 530 by the connection circuit 534, which may include at least one lumped element and a switching or matching circuit. When the connection circuit 534 is used as a switching circuit, the open stub 533 may be selectively and electrically connected to the first conductive pattern 530.

The multi-feeding antenna 500 may include a second conductive pattern 540 starting from and ending at a second access member 541 in the second antenna region A2 and formed in a rectangular loop shape. The second conductive pattern 540 may be electrically connected with the wireless communication circuit 560 via a matching circuit 542 and the second access member 541 disposed on the second conductive pattern 540, may include at least one matching circuit 543, 544 disposed on the second conductive pattern 540, and may operate as a loop type or open stub type radiator by means of the at least one matching circuit 543, 544.

When the structure 621 disposed in the PCB 520, the second access member 541 may be electrically connected with a fourth access member 641 disposed on a fourth conductive pattern 640 of the structure 621. The second conductive pattern 540 may operate in the second frequency band, with the fourth conductive pattern 641 of the structure 621.

The second access member 541 may be electrically connected with a second side surface 512 of a conductive material of the side surface member 510. The second side surface 512 may keep being physically separated from a first side surface 511 by a nonconductive member 516 disposed on the side surface member 510. At least a portion of the second side surface 512 separated by the nonconductive member 516 may include a protruding piece 5121 protruding toward the PCB 520 and electrically connected with the second access member 541 via an electric path 5122. The second side surface 512 electrically connected with the second access member 541 may operate in the first frequency band.

The multi-feeding antenna 500 may include a conductive path 550 disposed in the fill-cut region 522 of the PCB 520 to electrically connect the first access member 531 of the first antenna region A1 and the second access member 541 of the second antenna region A2. The conductive path 550 may have one end electrically connected to the first access member 531 and the other end electrically connected to the second access member 541. The multi-feeding antenna 500 may include elements 551, 552 disposed on the conductive path 550 and including a matching circuit for tuning an electric length of the conductive path 550 and/or a low pass filter (LPF) to enable only the first frequency band to pass therethrough and to block the second frequency band. For example, the multi-feeding antenna 500 may perform tuning and filtering operations using the elements 551, 552 by forming an isolation pattern, such as the conductive path, in the PCB 520.

FIG. 6 illustrates a structure including a conductive pattern according to embodiments.

Referring to FIGS. 5 and 6, a structure antenna 600 which is used as a portion of a multi-feeding antenna 500 may include a third conductive pattern 630 and a fourth conductive pattern 640 which are spaced apart from each other in the structure 621. The third conductive pattern 630 may include a third access member 631 to be electrically connected with a first access member 531 when the structure 621 is mounted in a PCB 520. The third conductive pattern 630 may be electrically connected with a first conductive pattern 530, and may be formed in the shape of an antenna radiator, such as a PIFA, operating in the first frequency band. The third conductive pattern 630 may include a sub pattern 6301 for generating an additional resonance with the first conductive pattern 530 formed in the PCB 520.

The fourth conductive pattern 640 may include a fourth access member 641 to be electrically connected with a second access member 541 when the structure 621 is mounted in the PCB 520, may be electrically connected with a second conductive pattern 540, and may be formed in the shape of an antenna radiator, such as a loop type having an opened portion, operating in the second frequency band.

Figure 7:
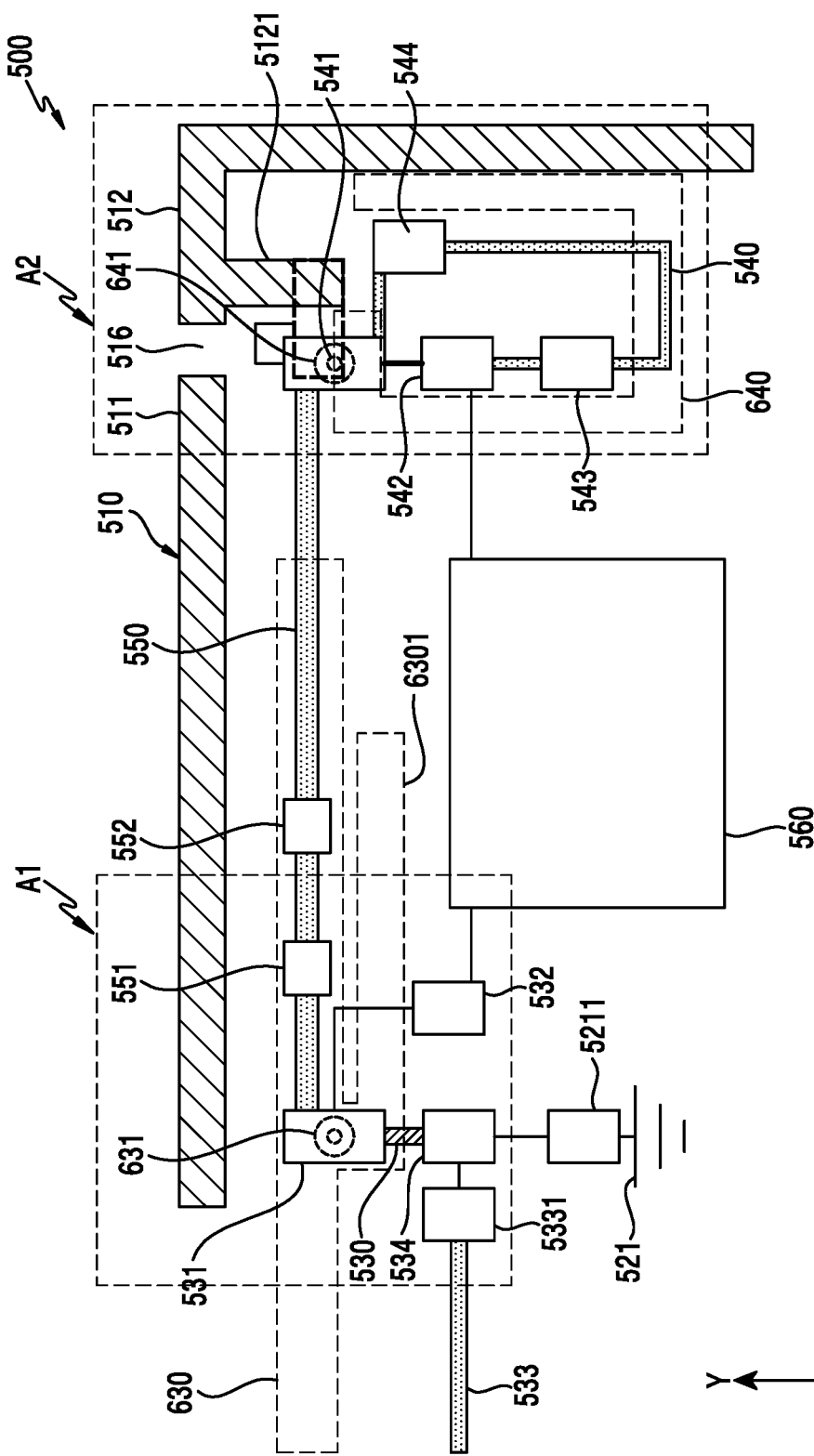
FIG. 7 illustrates a multi-feeding antenna according to embodiments.

FIG. 7 illustrates the multi-feeding antenna according to embodiments. For example, the multi-feeding antenna 500 of FIG. 7 may be disposed in the P3 region of the electronic device 300 of FIG. 3.

FIG. 7 illustrates the multi-feeding antenna 500 including the first conductive pattern 530 and the second conductive pattern 540 formed in the PCB 520, and a disposal relationship between the third conductive pattern 630 and the fourth conductive pattern 640 formed in the structure 621.

Referring to FIG. 7, the multi-feeding antenna 500 may include the first conductive pattern 530 disposed in a first portion A1 of the PCB 520, the second pattern 540 disposed in a second portion A2 of the PCB 520, and the conductive path 550 disposed in the PCB 520 to electrically connect the first conductive pattern 530 and the second conductive pattern 540. The conductive path 550 may connect the first access member 531 electrically connected with the first conductive pattern 530, and the second access member 541 electrically connected with the second conductive pattern 540.

According to embodiments, an end of the first conductive pattern 530 may be connected to the ground plane 521 by a matching circuit 5211. When the first conductive pattern 530 is connected to the ground plane 521 by the connection circuit 534, the first conductive pattern 530 may operate as a semi PIFA. When the first conductive pattern 530 is connected to the open stub 533 by the connection circuit 534, the open stub 533 may operate in the second frequency band through a matching circuit 5331. The first conductive pattern 530 may operate in the second frequency band through an electric path of the matching circuit 532, the first access member 531, the matching circuit 5211, and the ground plane 521. The first conductive pattern 530 may generate a pattern resonance operating in an additional second frequency band through the sub pattern 6301 of the third conductive pattern 630 disposed in the structure 621. The first conductive pattern 530 may adjust a resonance circuit, such as an electric length, through the open stub 533 using the connection circuit 534.

At least a portion of the third conductive pattern 630 disposed in the structure 621 may be disposed to overlap the first conductive pattern 530 in the Z-axis direction. At least a portion of the fourth conductive pattern 640 disposed in the structure 621 may be disposed to overlap the second conductive pattern 540 in the Z-axis direction. The first conductive pattern 530 may be electrically connected with the third conductive pattern 630 through the first access member 531 and the third access member 631.

The second conductive pattern 540 may be electrically connected with the fourth conductive pattern 640 through the second access member 541 and the fourth access member 641. For example, an entire single radiator may be implemented by electrically connecting the first conductive pattern 530 and the third conductive pattern 630 of the structure 621 electrically connected with the first conductive pattern 530, and the second conductive pattern 540 and the fourth conductive pattern 640 of the structure through the conductive path 550 disposed in the PCB 520. Since at least a portion of the conductive patterns is mounted in the structure 621 and is electrically connected with the patterns of the PCB 520, and simultaneously, at least some of the regions are disposed to overlap one another in the Z-axis direction, a design space that is relatively free from interference by other electronic components, such as a touch screen display, may be provided.

The isolation pattern for electrically connecting two feeding units of the single antenna radiator is disposed in the PCB 520, such that interference is reduced between different frequencies in the multi-band multi-feeding antenna, caused by the mounting of the elements 551, 552 including a frequency filtering means, such as a low pass filter or an electric length adjusting means, such as a matching circuit.

Figure 8:
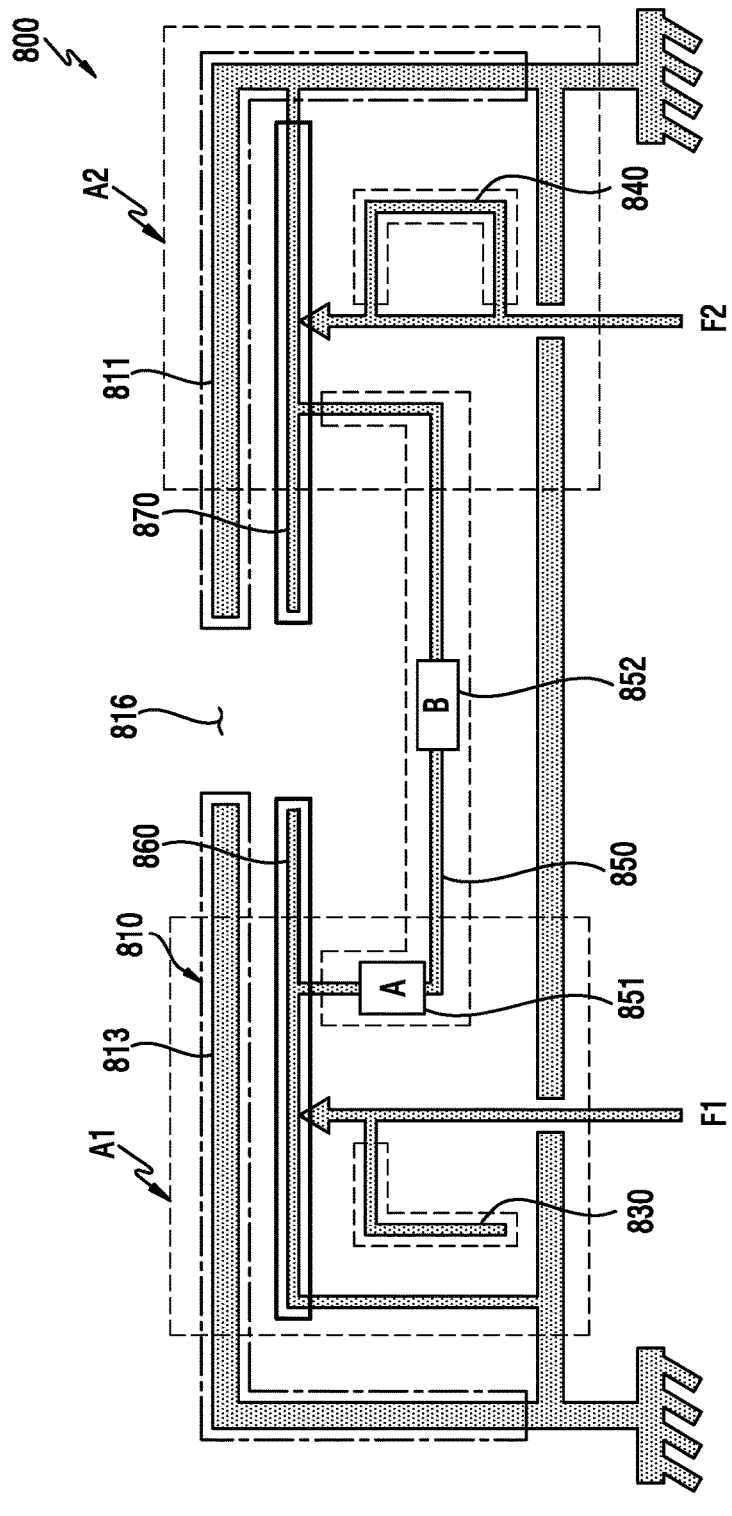
FIG. 8 illustrates a feeding structure of a multi-feeding antenna according to embodiments.

FIG. 8 illustrates a feeding structure of a multi-feeding antenna according to embodiments.

The multi-feeding antenna 800 may include a first antenna region A1 operating both in a first frequency band and a second frequency band higher than the first frequency band, a second antenna region A2 operating both at the first frequency band and the second frequency band, described above, and a conductive path 850 to electrically connect the first antenna region and the second antenna region.

The first antenna region A1 may include a first conductive pattern 830 disposed in a PCB region, such as the dashed line portion corresponding to the illustrated PCB region, and receiving signals corresponding to the first frequency band and the second frequency band from a wireless communication circuit at a first feeding position F1, and a third conductive pattern 860 electrically connected with the first conductive pattern 830 and disposed in a structure region, such as the solid line portion corresponding to the illustrated structure region. The first conductive pattern 830 may operate in the second frequency band, and the third conductive pattern 860 may operate in the first frequency band by coupling with a first metal member 813 used as a side surface member 810.

The second antenna region A2 may include a second conductive pattern 840 disposed in the PCB region and receiving signals corresponding to the first frequency band and the second frequency band from the wireless communication circuit at a second feeding position F2, and a fourth conductive pattern 870 electrically connected with the second conductive pattern 840 and disposed in the structure region. The second conductive pattern 840 may operate in the second frequency band, and a second metal member 811 used as the side surface member 810 may receive a feeding signal and operate in the first frequency band with the fourth conductive pattern 870.

The conductive path 850 disposed in the PCB region and electrically connecting the first conductive pattern 830 and the second conductive pattern 840 may be used as an isolation pattern between the two antenna regions, and may include elements A 851, B 852 disposed to perform a filtering role to enable only a specific frequency, such as the first frequency, to pass therethrough in order to guarantee smooth isolation between antenna regions and reduce mutual interference by different frequency bands operating in respective antenna regions. The elements A 851, B 852 may include a matching circuit or a low pass filter.

Figure 9A:
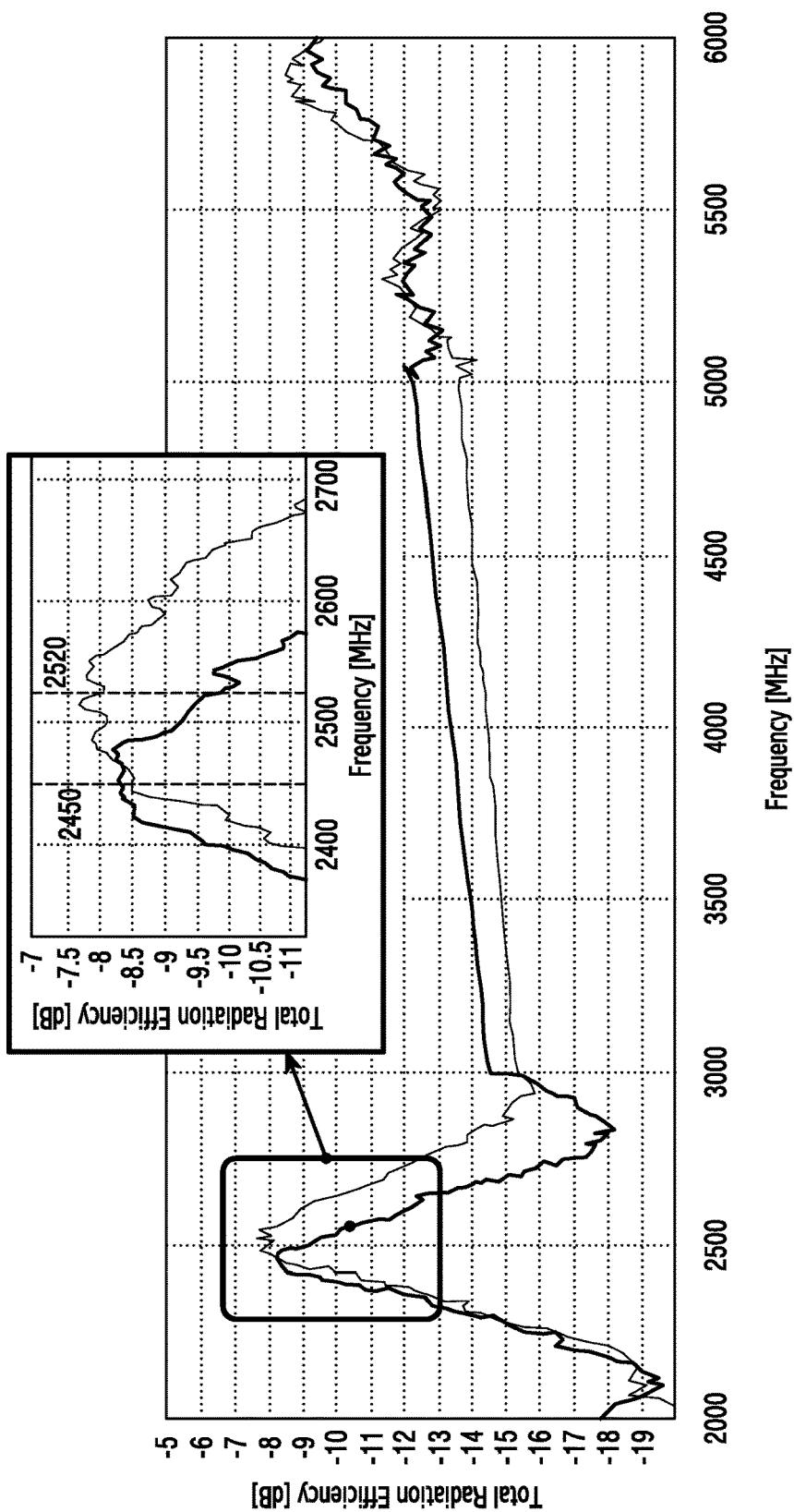
FIGS. 9A, 9B and 9C are graphs showing total radiation efficiency and a reflection coefficient implemented by the multi-feeding antenna according to embodiments.
Figure 9B:
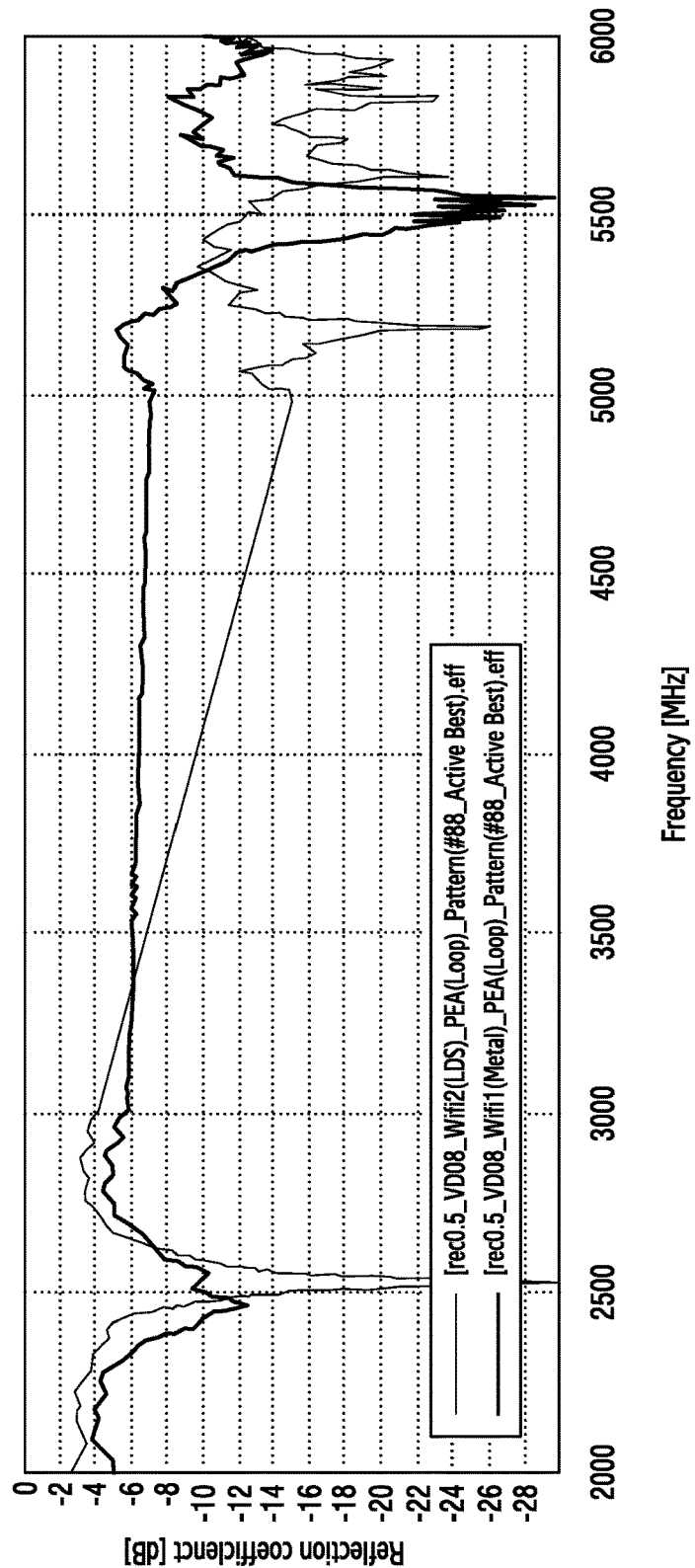

FIGS. 9A and 9B are graphs showing total radiation efficiency and a radiation coefficient implemented by the multi-feeding antenna according to embodiments.

Referring to FIGS. 9A and 9B, it can be seen that radiation performance of the multi-feeding antenna after the conductive path used as an isolation pattern and the second conductive pattern of the loop type are applied to the PCB is equivalent to performance of a related-art antenna disposed in a black matrix (BM) region, such as a region of a window other than a display region, including a relatively large inactivation region. The first antenna region and the second antenna region of the multi-feeding antenna smoothly operate in multiple frequency bands of the first frequency band and the second frequency band.

Figure 9C:
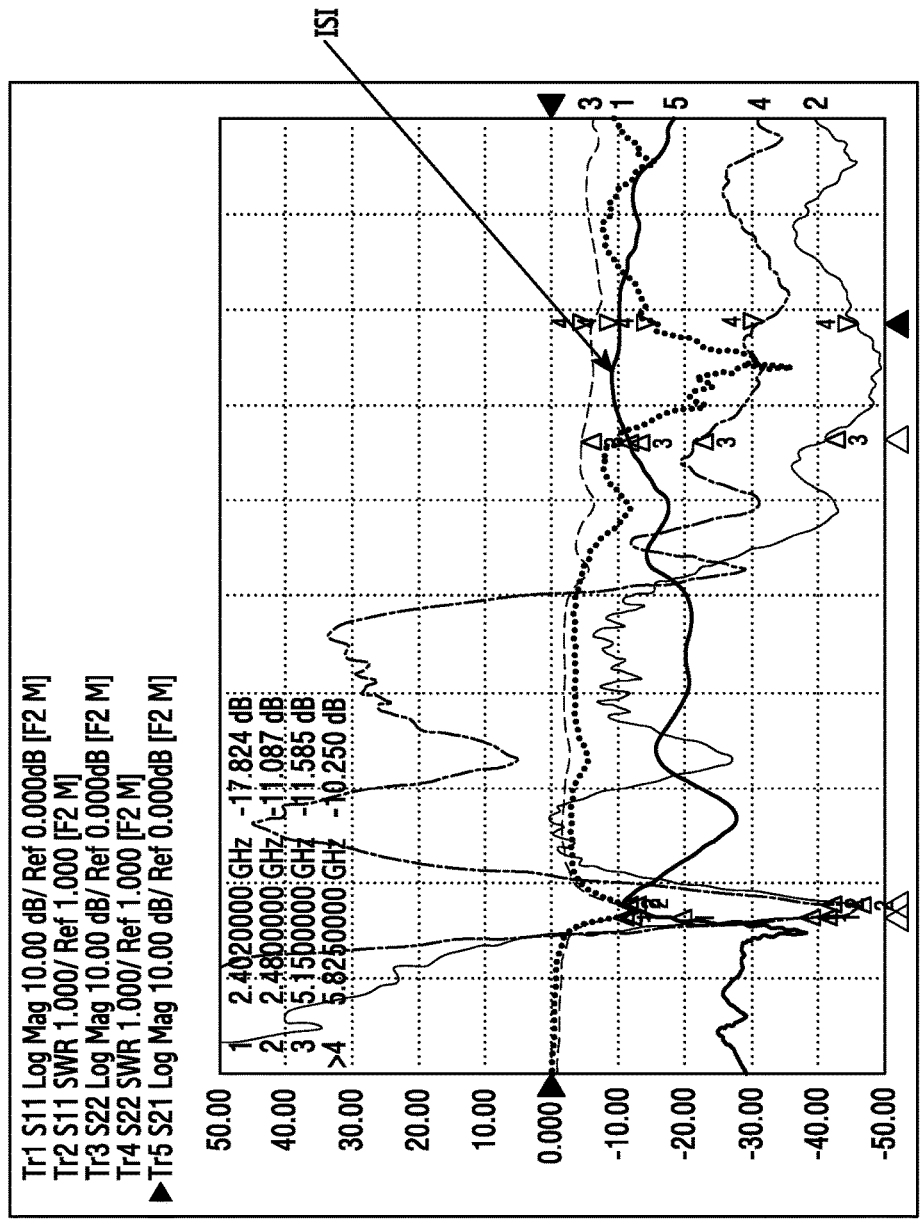

FIG. 9C is a graph showing an S21 isolation value ISI between a first antenna and a second antenna, and illustrates that an isolation loss which indicates a degree of interference between the two antennas is less than or equal to 10 dB, which is a normal level. Good performance between the two antennas is illustrated in FIG. 9A.

The electronic device may provide a multi-feeding antenna operating in multiple frequency bands by reducing performance degradation, and can contribute to slimness by implementing at least a portion of the patterns in the PCB.

According to an embodiment, an electronic device includes a housing including a first plate, a second plate facing toward a direction opposite the first plate, and a side surface member surrounding a space between the first plate and the second plate, the side surface member being integrally formed with the second plate or being attached to the second plate, a touch screen display exposed through a portion of the first plate, a PCB disposed in parallel between the first plate and the second plate, a wireless communication circuit mounted in the PCB, a first conductive pattern formed in a first portion of the PCB, a second conductive pattern formed in a second portion of the PCB when viewed from the upper portion of the second plate, at least a portion of the wireless communication circuit being interposed between the first conductive pattern and the second conductive pattern, and a conductive path formed on the PCB to electrically connect between the first conductive pattern and the second conductive pattern, wherein the wireless communication circuit is configured to provide a first signal having a first frequency and a second signal having a second frequency higher than the first frequency to the first conductive pattern and the second conductive pattern.

The first frequency may be 2.4 GHz, and the second frequency may be 5 GHz.

The electronic device may further include a structure formed of a high molecular material and disposed between the second plate and the PCB, a third conductive pattern disposed on the structure, and a fourth conductive pattern disposed on the structure, and, when viewed from the upper portion of the second plate, the third conductive pattern may overlap the first conductive pattern at least in part, and the fourth conductive pattern may overlap the second conductive pattern at least in part.

The third conductive pattern may be electrically connected with the first conductive pattern, and the fourth conductive pattern may be electrically connected with the second conductive pattern.

The third conductive pattern may be disposed at a position where the third conductive pattern is able to perform coupling with the side surface member, and may operate in the first frequency band.

The electronic device may further include at least one low pass filter disposed on the conductive path.

The PCB may include a ground plane, and the first conductive pattern may be electrically connected to the ground plane.

The second conductive pattern may not be electrically connected to the ground plane.

The electronic device may further include a cellular communication circuit, and the side surface member may be formed of a conductive material at least in part, and may be electrically connected to the cellular communication circuit.

At least a portion of the side surface member may be formed of a metallic material, and the second conductive pattern may be connected to the side surface member of the metallic material, and may be coupled to the side surface member to operate in the first frequency.

The side surface member may be formed of unit members segmented by at least one pair of nonconductive members, and the unit member may be electrically connected with the second conductive pattern.

The second conductive pattern may be formed in a loop shape with reference to a region for receiving the first signal and the second signal from the wireless communication circuit.

At least one matching circuit may be disposed on a path of the second conductive path to determine the second conductive pattern as a loop type or an open stub type.

A fifth conductive pattern may be disposed on the periphery of the first conductive pattern of the PCB, and the fifth conductive pattern may be selectively and electrically connected with the first conductive pattern.

When the fifth conductive pattern is electrically connected with the first conductive pattern, the fifth conductive pattern may operate in the second frequency band.

The conductive path disposed in the PCB may be disposed to avoid overlapping the touch screen display when viewed from the upper portion of the second plate.

The electronic device may further include at least one matching circuit disposed on the conductive path.

According to an embodiment, an electronic device includes a housing including a first plate, a second plate facing toward a direction opposite the first plate, and a side surface member surrounding a space between the first plate and the second plate, the side surface member being integrally formed with the second plate or being attached to the second plate, a PCB disposed in parallel between the first plate and the second plate, a wireless communication circuit mounted in the PCB, a first conductive pattern disposed in a first portion of the PCB, a second conductive pattern disposed in a second portion of the PCB, a conductive path disposed on the PCB to electrically connect between the first conductive pattern and the second conductive pattern, a structure of a dielectric material disposed to overlap at least a portion of the PCB on the PCB, a third conductive pattern disposed on the structure and electrically connected with the first conductive pattern, and a fourth conductive pattern disposed on the structure to be electrically disconnected from the third conductive pattern, and electrically connected with the second conductive pattern, wherein the wireless communication circuit is configured to provide a first signal having a first frequency and a second signal having a second frequency higher than the first frequency to the first conductive pattern and the second conductive pattern.

When viewed from the upper portion of the second plate, the third conductive pattern may overlap the first conductive pattern at least in part, and the fourth conductive pattern may overlap the second conductive pattern at least in part.

Each of the above-mentioned elements may be configured with one or more components, and the names of the elements may be changed according to the type of the electronic device. The electronic device may include at least one of the above-mentioned elements, some elements may be omitted or other additional elements may be added, and some of the elements of the electronic device may be combined with each other so as to form one entity, so that the functions of the elements may be performed in the same manner as prior to the combination.

While the present disclosure has been shown and described with reference to embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   a housing comprising a first plate, a second plate facing toward a direction opposite the first plate, and a side surface member surrounding a space between the first plate and the second plate, the side surface member being integrally formed with or attached to the second plate;
   a touch screen display exposed through a portion of the first plate;
   a printed circuit board (PCB) disposed in parallel between the first plate and the second plate;
   a wireless communication circuit mounted in the PCB;
   a first conductive pattern formed in a first portion of the PCB;
   a second conductive pattern formed in a second portion of the PCB when viewed from the upper portion of the second plate, at least a portion of the wireless communication circuit being interposed between the first conductive pattern and the second conductive pattern; and
   a conductive path formed on the PCB and electrically connecting the first conductive pattern and the second conductive pattern,
   wherein the wireless communication circuit is configured to provide a first signal having a first frequency and a second signal having a second frequency higher than the first frequency to the first conductive pattern and the second conductive pattern.

2. The electronic device of claim 1, wherein the first frequency is 2.4 gigahertz (GHz), and the second frequency is 5 GHz.

3. The electronic device of claim 1, further comprising:
   a structure formed of a high molecular material and disposed between the second plate and the PCB;
   a third conductive pattern disposed on the structure; and
   a fourth conductive pattern disposed on the structure,
   wherein, when viewed from the upper portion of the second plate, the third conductive pattern at least partly overlaps the first conductive pattern, and the fourth conductive pattern at least partly overlaps the second conductive pattern.

4. The electronic device of claim 3, wherein the third conductive pattern is electrically connected with the first conductive pattern, and the fourth conductive pattern is electrically connected with the second conductive pattern.

5. The electronic device of claim 4, wherein the third conductive pattern is disposed at a position where the third conductive pattern is able to perform coupling with the side surface member.

6. The electronic device of claim 4, wherein the third conductive pattern operates in the first frequency band.

7. The electronic device of claim 1, further comprising at least one low pass filter disposed on the conductive path.

8. The electronic device of claim 1, wherein the PCB comprises a ground plane, and the first conductive pattern is electrically connected to the ground plane.

9. The electronic device of claim 8, wherein the second conductive pattern is not electrically connected to the ground plane.

10. The electronic device of claim 9, further comprising a cellular communication circuit,
wherein the side surface member is at least partly formed of a conductive material, and the cellular communication circuit is electrically connected to the side surface member.

11. The electronic device of claim 1, wherein at least a portion of the side surface member is formed of a metallic material, and
wherein the second conductive pattern is connected to the side surface member of the metallic material, and is coupled to the side surface member to operate in the first frequency.

12. The electronic device of claim 11, wherein the side surface member is formed of unit members segmented by at least one pair of nonconductive members, and the unit members are electrically connected with the second conductive pattern.

13. The electronic device of claim 1, wherein the second conductive pattern is formed in a loop shape with reference to a region for receiving the first signal and the second signal from the wireless communication circuit.

14. The electronic device of claim 13, wherein at least one matching circuit is disposed on a path of the second conductive path to determine the second conductive pattern as a loop type or an open stub type.

15. The electronic device of claim 14, wherein the fifth conductive pattern operates in the second frequency band when the fifth conductive pattern is electrically connected with the first conductive pattern.

16. The electronic device of claim 1, wherein a fifth conductive pattern is disposed on a periphery of the first conductive pattern of the PCB, and wherein the fifth conductive pattern is selectively and electrically connected with the first conductive pattern.

17. The electronic device of claim 1, wherein the conductive path disposed in the PCB in a manner that avoids overlapping the touch screen display when viewed from the upper portion of the second plate.

18. The electronic device of claim 1, further comprising at least one matching circuit disposed on the conductive path.

19. An electronic device comprising:
a housing comprising a first plate, a second plate facing toward a direction opposite the first plate, and a side surface member surrounding a space between the first plate and the second plate, the side surface member being integrally formed with the second plate or being attached to the second plate;
a printed circuit board (PCB) disposed in parallel between the first plate and the second plate;
a wireless communication circuit mounted in the PCB;
a first conductive pattern disposed in a first portion of the PCB;
a second conductive pattern disposed in a second portion of the PCB;
a conductive path disposed on the PCB and electrically connecting the first conductive pattern and the second conductive pattern;
a structure of a dielectric material disposed to overlap at least a portion of the PCB on the PCB;
a third conductive pattern disposed on the structure and electrically connected with the first conductive pattern; and
a fourth conductive pattern disposed on the structure and electrically disconnected from the third conductive pattern, and electrically connected with the second conductive pattern,
wherein the wireless communication circuit is configured to provide a first signal having a first frequency and a second signal having a second frequency higher than the first frequency to the first conductive pattern and the second conductive pattern.

20. The electronic device of claim 19, wherein, when viewed from an upper portion of the second plate, the third conductive pattern at least partly overlaps the first conductive pattern, and the fourth conductive pattern at least partly overlaps the second conductive pattern.

* * * * *